US007012004B2

(12) United States Patent
Tseng et al.

(10) Patent No.: US 7,012,004 B2

(45) Date of Patent: Mar. 14, 2006

(54) METHOD OF MANUFACTURING A NONVOLATILE MEMORY CELL WITH TRIPLE SPACERS AND THE STRUCTURE THEREOF

(75) Inventors: U-Way Tseng, Taichung (TW); Hung-Yu Chiu, Kaohsiung (TW); Wen-Pin Lu, Ilan (TW); Pao-Ling Hwang, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 4 days.

(21) Appl. No.: 11/128,402

(22) Filed: May 13, 2005

(65) Prior Publication Data

US 2005/0208720 A1 Sep. 22, 2005

Related U.S. Application Data

(62) Division of application No. 10/390,690, filed on Mar. 19, 2003.

(30) Foreign Application Priority Data

Mar. 20, 2002 (TW) ............................... 91105303 A

(51) Int. Cl.
*H01L 21/8247* (2006.01)

(52) U.S. Cl. ....................................... 438/257; 438/593

(58) Field of Classification Search ........ 438/257–267, 438/593–594

See application file for complete search history.

(56) References Cited

U.S. PATENT DOCUMENTS

| | | | | |
|---|---|---|---|---|
| 6,686,242 | B1 | 9/2002 | Willer et al. | |
| 6,555,865 | B1 | 1/2003 | Lee et al. | |
| 6,627,504 | B1 * | 9/2003 | Bertrand et al. | 438/303 |
| 6,677,201 | B1 * | 1/2004 | Bu et al. | 438/257 |

FOREIGN PATENT DOCUMENTS

| | | |
|---|---|---|
| TW | 452977 | 9/2001 |

* cited by examiner

*Primary Examiner*—Richard A. Booth

(74) *Attorney, Agent, or Firm*—Birch, Stewart, Kolasch & Birch, LLP

(57) ABSTRACT

A method of manufacturing a nonvolatile memory cell with triple spacers and the structure thereof. A gate structure is formed on a substrate. Diffusion regions are formed in the substrate on either side of the gate structure. A linear oxide layer is formed on the gate structure and the substrate. A conformal nitride layer is formed on the linear oxide layer. The nitride layer and the linear oxide layer are partially etched back to form linear oxide spacers on the sides of the gate structure and nitride spacers on the sides of the linear oxide spacers. A conformal oxide layer is formed on the linear oxide spacers, the nitride spacers, the gate structure and the substrate. The oxide layer is partially etched back to form oxide spacers on the sides of the nitride spacers.

10 Claims, 6 Drawing Sheets

METHOD OF MANUFACTURING A NONVOLATILE MEMORY CELL WITH TRIPLE SPACERS AND THE STRUCTURE THEREOF

This application is a Divisional of co-pending application Ser. No. 10/390,690, filed on Mar. 19, 2003, and for which priority is claimed under 35 U.S.C. § 120; and this application claims priority of Application No. 091105303 filed in Taiwan, R.O.C. on Mar. 20, 2002 under 35 U.S.C. § 119; the entire contents of all are hereby incorporated by reference.

BACKGROUND OF THE INVENTION

1. Field of the Invention

The present invention relates to the semiconductor manufacturing process, and more particularly, to a method of manufacture that reduces charge loss in a nonvolatile memory cell and the structure thereof.

2. Description of the Related Art

Nonvolatile memory cell arrays such as EPROMs, FLASH EPROMs and EEPROMs have gained widespread acceptance in the industry. Nonvolatile memory cells do not require the periodic reflesh pulses needed by the capacitive storage elements of conventional one-device dynamic random access memory (DRAM) cells. This presents appreciable power savings. Because they rely upon charge injection/removal to establish the stored logic state, the write cycles of nonvolatile memory cells are appreciably longer than those of DRAM's.

It has been observed that there are data retention problems in nonvolatile memory cell arrays. It has been postulated that the poor data retention is due to mobile ions such as $Na^+$, $K^+$, or the like that approach the floating gate in the nonvolatile memory cell and cause the charge on the floating gate to be lost. For example, an inter-layer dielectric (ILD) layer (of a high dielectric reflowable material such as phosphosilicate glass or borophosphosilicate glass) is formed on the wafer. The manufacturing process for forming the ILD layer, such as deposition, photolithography and etching, causes the mobile ions to be introduced to approach the floating gate in the nonvolatile memory cell, seriously affecting device reliability.

FIG. 1 shows a structure 100 of a traditional flash memory cell, comprising a silicon substrate 110 whereon a gate structure 120 is formed. Silicon oxide spacers 130 are formed on the sides of the gate structure 120. A source region 140 and a drain region 150 are separately formed in the substrate 100 on either side of the gate structure 120. Moreover, the gate structure 120 comprises a tunnel oxide layer 122 formed on part of the substrate 110. A floating gate 124 is formed on the tunnel oxide layer 122, an inter-gate dielectric layer 126 on the floating gate 124, and a control gate 128 on the inter-gate dielectric layer 126.

Since silicon oxide layers cannot effectively stop the diffusion of mobile ions, the traditional structure 100 with silicon oxide spacers 130 cannot solve the problem mentioned previously.

SUMMARY OF THE INVENTION

It is therefore an object of the present invention to provide a method and a structure for improving the reliability of a nonvolatile memory cell by manufacture with triple dielectric spacers.

It is another object of the present invention to provide a method and structure for reducing charge loss in a nonvolatile memory cell.

To accomplish the above objects, the present invention provides a method of improving the reliability of a nonvolatile memory cell. At least one gate structure is formed on a substrate. Diffusion regions are formed in the substrate on either side of the gate structure. A conformal linear oxide layer is formed on the gate structure and the substrate. A conformal nitride layer is formed on the linear oxide layer. The nitride layer and the linear oxide layer are partially etched back to expose a partial surface of the substrate and the top surface of the gate structure, and to form linear oxide spacers on the sides of the gate structure and nitride spacers on the sides of the linear oxide spacers. A conformal oxide layer is formed on the linear oxide spacers, the nitride spacers, the gate structure and the substrate. The oxide layer is partially etched back to expose a partial surface of the substrate and the top surface of the gate structure, and to form oxide spacers on the sides of the nitride spacers.

The structure of a nonvolatile memory cell of the present invention is also provided. The structure comprises a substrate having a gate structure. Linear oxide spacers are formed on the sides of the gate structure, where the linear oxide spacer is 50~250 angstroms. Nitride spacers are formed on the sides of the linear oxide spacers, where the nitride spacer is 100~300 angstroms. Oxide spacers are formed on the sides of the nitride spacers, where the oxide spacer is 2000~3000 angstroms. Diffusion regions are formed in the substrate on either side of the gate structure.

The present invention improves on the prior art in that the nonvolatile memory cell structure has triple dielectric spacers including the linear oxide spacers, the nitride spacers and the oxide spacers. The nitride spacers prevent the mobile ions from approaching the floating gate in the nonvolatile memory cell. Thus, the invention can decrease charge loss, thereby improving reliability and yield, and ameliorating the disadvantages of the prior art. Additionally, because the nitride spacers are thin, only about 200 angstroms, they do not affect the subsequent via hole etching process.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

FIGS. 2~7 are sectional diagrams of an embodiment of the present invention.

Figure 1:
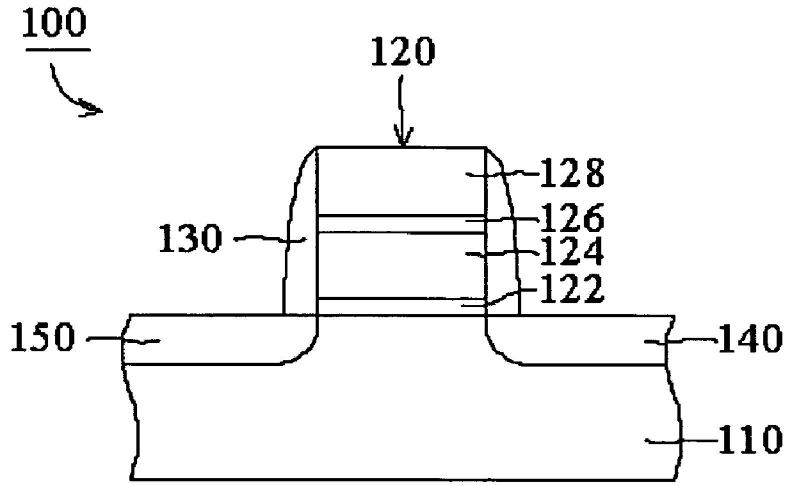
FIG. 1 is a schematic view of the memory cell structure of the prior art.
Figure 2:
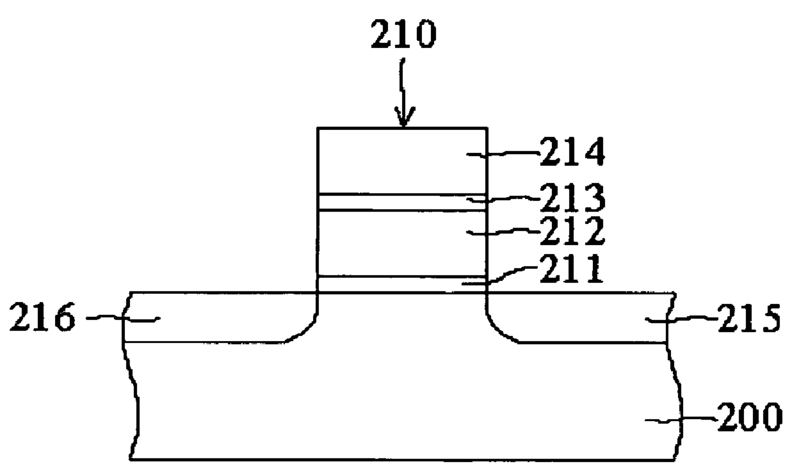
FIGS. 2~7 are sectional diagrams of an embodiment of the present invention.

In FIG. 2, a semiconductor substrate 200 such as a silicon substrate is provided. At least one gate structure 210 of a nonvolatile memory cell is formed on the substrate 200. The nonvolatile memory cell can be a Mask ROM, an EPROM cell, a flash memory cell or an EEPROM cell. As a demonstrative example, the gate structure 210 of the flash memory cell is formed on the substrate 200 in the present embodiment. The method of forming the gate structure 210, referring to FIG. 2, comprises a tunnel oxide layer 211 formed on part of the substrate 200. A floating gate 212 is formed on the tunnel oxide layer 211. An inter-gate dielectric layer 213 is formed on the floating gate 212. A control gate 214 is formed on the inter-gate dielectric layer 213. The tunnel oxide layer 211 may be a $SiO_2$ layer formed by thermal oxidation. The floating gate 212 may be a polysilicon layer formed by deposition. The inter-gate dielectric layer 213 may be a $SiO_2$ layer formed by thermal oxidation or an ONO layer formed by deposition. The control gate 214 may be a polysilicon layer formed by deposition.

In FIG. 2, diffusion regions such as a source region 215 and a drain region 216 are formed in the substrate 200 on either side of the gate structure 120.

Figure 3:
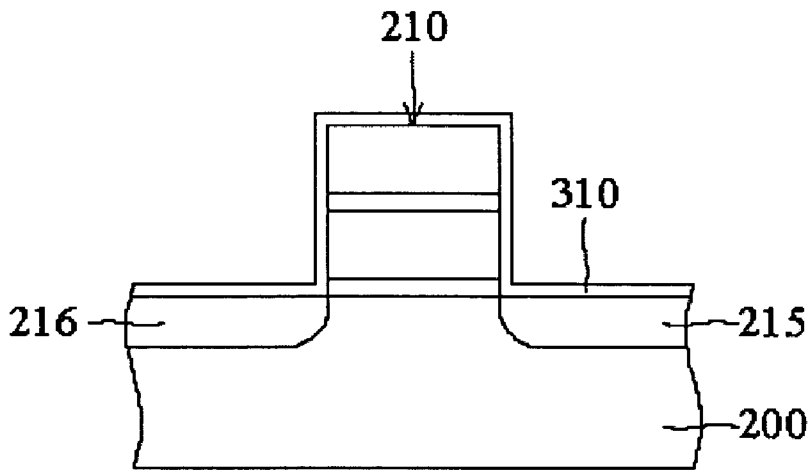

In FIG. 3, a conformal linear oxide layer 310 is formed on the gate structure 210 and the substrate 200. The linear oxide layer 310 should be approximately 50~250 angstroms in thickness. It is preferred that the method of forming the linear oxide layer 310 be thermal oxidation such as ISSG (in situ stream generation).

Figure 4:
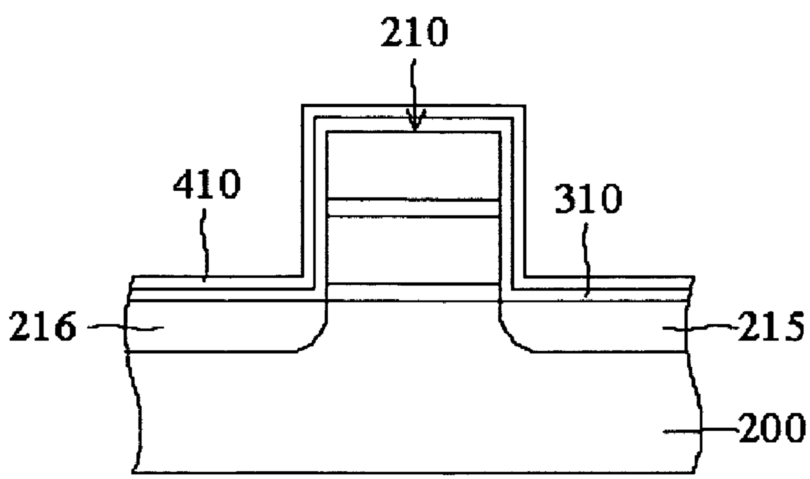

In FIG. 4, a conformal nitride layer 410 is formed on the linear oxide layer 310. The nitride layer 410 should be approximately 100~300 angstroms in thickness. It is preferred that the nitride layer 410 be a SiN layer or a SiON layer formed by CVD.

Figure 5:
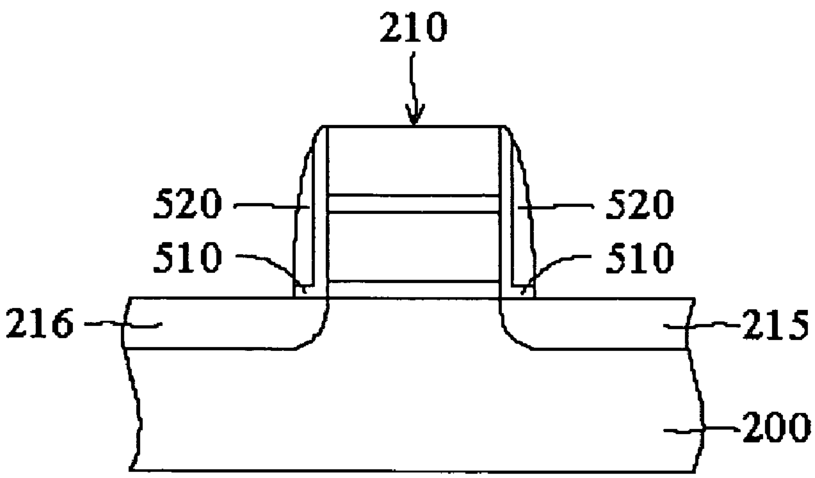

In FIG. 5, parts of the nitride layer 410 and the linear oxide layer 310 are etched back to expose a partial surface of the substrate 200 and the top surface of the gate structure 210. Thus, linear oxide spacers 510, 510 are formed on the sides of the gate structure 210 and nitride spacers 520, 520 are formed on the sides of the linear oxide spacers 510. The method of removing parts of the nitride layer 410 and the linear oxide layer 310 is anisotropic etching such as dry etching. Moreover, the linear oxide spacer 510 is, preferably, controlled at about 100 angstroms in thickness. The nitride spacer 520 is, preferably, controlled at about 200 angstroms in thickness.

Figure 6:
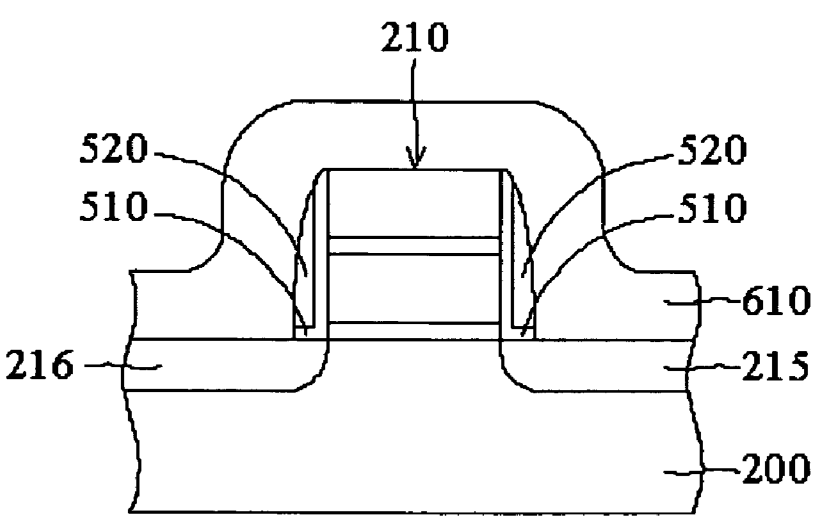

In FIG. 6, a conformal oxide layer 610 is formed on the linear oxide spacers 510, the nitride spacers 520, the gate structure 210 and the substrate 200. The oxide layer 610 should be approximately 2000~3000 angstroms in thickness. It is preferred that the oxide layer 610 be a TEOS-$SiO_2$ layer formed by CVD.

Figure 7:
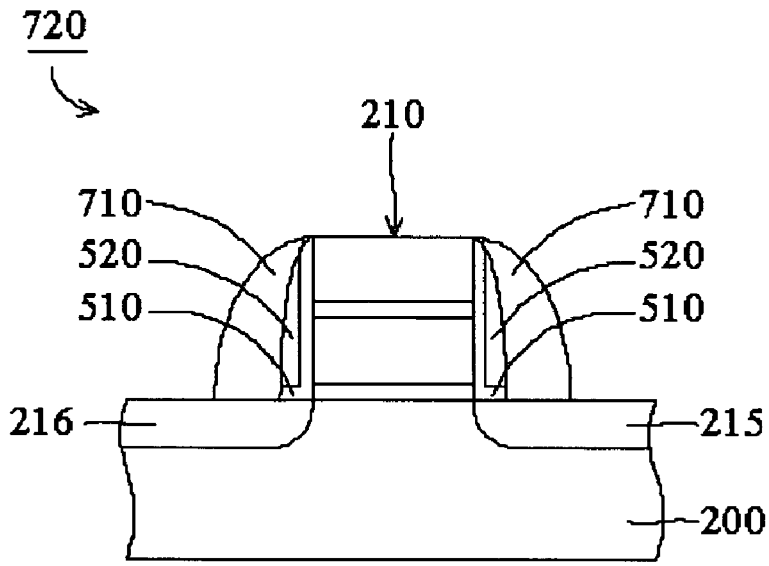

In FIG. 7, part of the oxide layer 610 is etched back to expose a partial surface of the substrate 200 and the top surface of the gate structure 210. Thus, oxide spacers 710, 710 are formed on the sides of the nitride spacers 520. The method of removing part of the oxide layer 610 is anisotropic etching such as dry etching. The oxide spacer 710 is, preferably, controlled at about 2000 angstroms in thickness.

FIG. 7 shows a structure 720 of the nonvolatile memory cell with triple dielectric spacers. The structure 720 comprises a substrate 200 having a gate structure 210. Linear oxide spacers 510 are formed on the sides of the gate structure 210, where the linear oxide spacer 510 is 50~250 angstroms, preferably about 100 angstroms. Nitride spacers 520 are formed on the sides of the linear oxide spacers 510, where the nitride spacer 520 is 100~300 angstroms, preferably about 200 angstroms. Oxide spacers 710 are formed on the sides of the nitride spacers 520, where the oxide spacer 710 is 2000~3000 angstroms, preferably about 2000 angstroms. Diffusion regions 215, 216 are formed in the substrate 200 on either side of the gate structure 210. The gate structure 210 further includes a tunnel oxide layer 211 formed on part of the substrate 200. A floating gate 212 is formed on the tunnel oxide layer 211. An inter-gate dielectric layer 213 is formed on the floating gate 212. A control gate 214 is formed on the inter-gate dielectric layer 213. Additionally, the linear spacers 510 comprise $SiO_2$. The nitride spacers 520 comprise SiN or SiON. The oxide spacers 710 comprise $SiO_2$.

Figure 8:
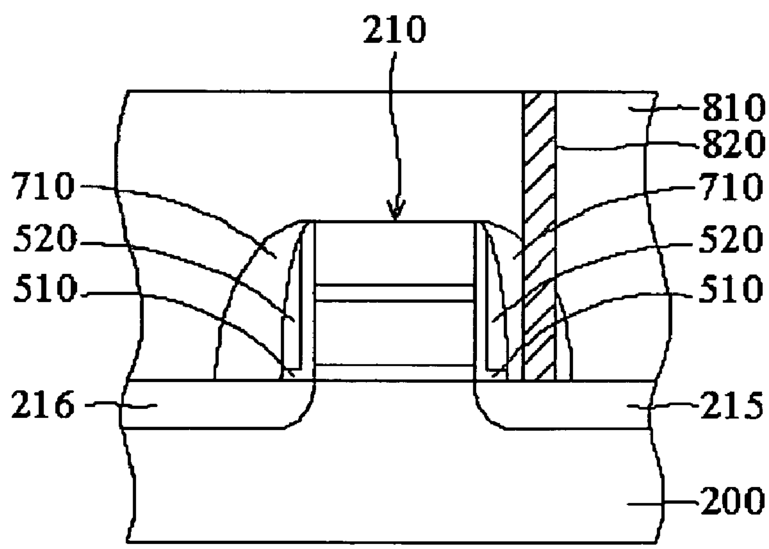
FIG. 8 is a schematic view illustrating the advantage of the memory cell structure of the present invention.

FIG. 8 shows a schematic view of the nonvolatile memory cell structure 720 of the present invention experiencing misalignment. A dielectric layer 810 is formed on the substrate 200, the oxide spacers 710 and the gate structure 210. A via hole 820 penetrating the dielectric layer 810 is formed, for example, by dry etching. When defining a via hole 820, if misalignment occurs, because the nitride spacer 520 is very thin (about 200 angstroms), the via hole 820 will not stop at the surface of the nitride spacer 520.

Because the nitride spacer 520 is very thin (about 200 angstroms), the stress on the nitride spacer 520 is minor, raising reliability.

Because the nitride spacer 520 is very thin (about 200 angstroms), heat consumption of depositing the nitride spacer 520 is lowered, reducing costs.

The mobile ion blocking effect of the nitride spacer 520 is very good, raising performance. The mobile ion blocking effect of the oxide layer and the nitride layer will now be illustrated by the following examples.

EXAMPLE 1

Figure 9A:
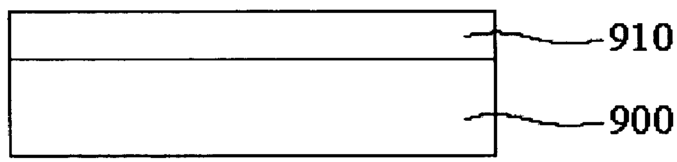
FIG. 9*a* is a schematic view of a sample with $SiO_2$ layer used in the mobile ion blocking test.
Figure 9B:
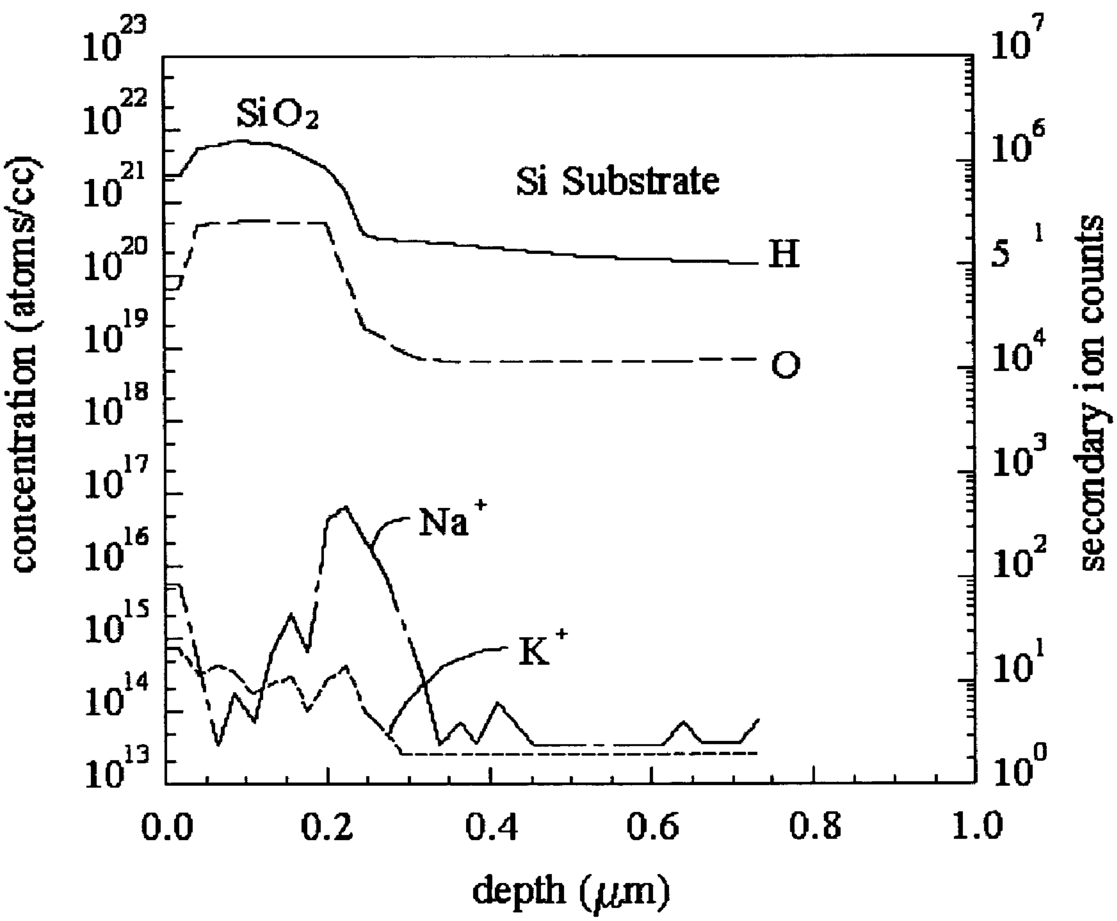
FIG. 9*b* is a qualitative analysis graph showing the mobile ions can penetrate the $SiO_2$ layer.

FIG. 9*a* shows a schematic view of a sample with $SiO_2$ layer used in the mobile ion blocking test. FIG. 9*b* shows a qualitative analysis graph showing the mobile ions can penetrate the $SiO_2$ layer of the sample shown in FIG. 9*a*, analyzed with a SIMS (secondary ion mass spectrometer).

In FIG. 9*a*, a $SiO_2$ layer 910 whose thickness is about 2000 angstroms is formed on a silicon substrate 900. The mobile ions ($Na^+$, $K^+$) are applied from above to the $SiO_2$ layer 910. As shown in FIG. 9*b*, after 2000 angstroms (0.2 $\mu$m), the concentration of mobile ions is still high, indicating that the mobile ions can penetrate the $SiO_2$ layer 910. Thus, the structure 100 of the prior art cannot prevent the mobile ions from approaching the floating gate.

Example 2

Figure 10A:
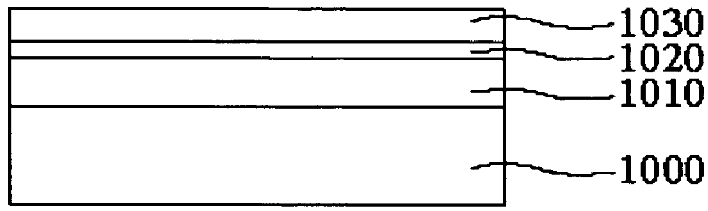
FIG. 10*a* is a schematic view of a sample with SiN layer used in the mobile ion blocking test.
Figure 10B:
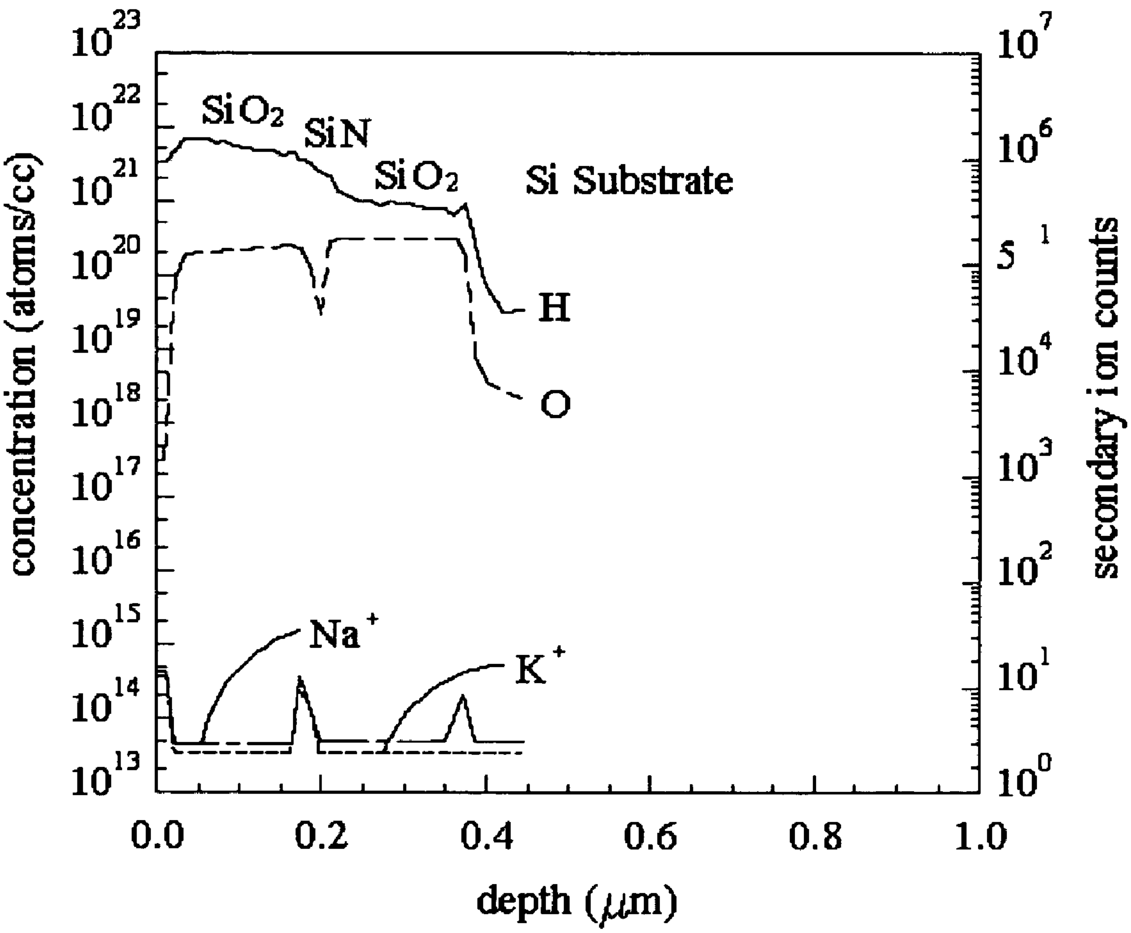
FIG. 10*b* is a qualitative analysis graph showing the mobile ions cannot penetrate the SiN layer.

FIG. 10*a* shows a schematic view of a sample with SiN layer used in the mobile ion blocking test. FIG. 10*b* shows a qualitative analysis graph showing that the mobile ions cannot penetrate the SiN layer of the sample shown in FIG. 10*a*, analyzed with a SIMS (secondary ion mass spectrometer).

In FIG. 10*a*, a $SiO_2$ layer 1010 whose thickness is about 2000 angstroms is formed on a silicon substrate 1000. A SiN layer 1020 whose thickness is about 200 angstroms is formed on the $SiO_2$ layer 1010. Then, a $SiO_2$ layer 1030 whose thickness is about 1700 angstroms is formed on the SiN layer 1020. The mobile ions ($Na^+$, $K^+$) are applied from above to the $SiO_2$ layer 1030. As shown in FIG. 10*b*, after 1700 angstroms (0.17 $\mu$m), the concentration of mobile ions is low, indicating that the SiN layer 1020 can block the mobile ions.

Thus, the present invention provides a manufacturing method and structure for nonvolatile memory with triple spacers including linear oxide spacers, nitride spacers, and oxide spacers. The thin nitride spacer prevents the mobile ions from approaching the floating gate in the nonvolatile memory cell, but does not affect the subsequent via hole etching process. Thus, the invention decreases charge loss, improving device reliability and ameliorating the disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of manufacturing a nonvolatile memory cell, comprising:

providing a substrate;

forming at least one gate structure on the substrate;

forming diffusion regions in the substrate on either side of the gate structure;

forming a conformal linear oxide layer on the gate structure and the substrate;

forming a conformal nitride layer on the linear oxide layer;

anisotropically etching the nitride layer and the linear oxide layer to expose a partial surface of the substrate and the top surface of the gate structure, thereby forming linear oxide spacers on the sides of the gate structure and nitride spacers on the sides of the linear oxide spacers;

forming a conformal oxide layer on the linear oxide spacers, the nitride spacers, the gate structure and the substrate; and anisotropically etching the oxide layer to expose a partial surface of the substrate and the top surface of the gate structure, thereby forming oxide spacers on the sides of the nitride spacers, to form said nonvolatile memory cell;

wherein, mobile ions are blocked from approaching the gate structure by means of the nitride spacers.

2. The method according to claim 1, further comprising the step of:

forming a dielectric layer on the oxide spacers, the gate structure and the substrate.

3. The method according to claim 1, wherein the method of forming the gate structure comprises the steps of:

forming a tunnel oxide layer on part of the substrate;

forming a floating gate on the tunnel oxide layer;

forming an inter-gate dielectric layer on the floating gate; and forming a control gate on the inter-gate dielectric layer.

4. The method according to claim 1, wherein the linear oxide layer is a silicon oxide layer formed by thermal oxidation.

5. The method according to claim 1, wherein the linear oxide layer is about 50 ~250 angstroms.

6. The method according to claim 1, wherein the nitride layer is a silicon nitride layer formed by deposition.

7. The method according to claim 1, wherein the nitride layer is a silicon oxynitride layer formed by deposition.

8. The method according to claim 1, wherein the nitride layer is about 100 ~300 angstroms.

9. The method according to claim 1, wherein the oxide layer is a silicon oxide layer formed by deposition.

10. The method according to claim 1, wherein the oxide layer is about 2000~3000 angstroms.

* * * * *